(12) United States Patent
Lake (10) Patent No.: US 6,717,836 B2
(45) Date of Patent: Apr. 6, 2004

(54) METHOD AND APPARATUS FOR NON-VOLATILE MEMORY STORAGE

(75) Inventor: Jeffrey H. Lake, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 74 days.

(21) Appl. No.: 09/990,153

(22) Filed: Nov. 21, 2001

(65) Prior Publication Data

US 2002/0064068 A1 May 30, 2002

Related U.S. Application Data

(60) Provisional application No. 60/253,220, filed on Nov. 27, 2000.

(51) Int. Cl.[7] .............................................. G11C 7/00
(52) U.S. Cl. .............................. 365/97; 365/158; 365/66
(58) Field of Search ......................... 365/97, 171, 158, 365/33, 50, 66, 55; 257/200; 324/67

(56) References Cited

U.S. PATENT DOCUMENTS

| | | | |
|---|---|---|---|
| 3,048,829 A | 8/1962 | Bradley | |
| 3,223,985 A | 12/1965 | Bittman et al. | |
| 3,418,645 A | 12/1968 | Fussell | |
| 3,466,634 A | 9/1969 | Gamblin | |
| 3,587,070 A * | 6/1971 | Thomas | 365/66 |
| 3,631,412 A | 12/1971 | Harding | 340/174 |
| 3,671,951 A * | 6/1972 | Lee | 365/97 |
| 3,727,199 A | 4/1973 | Lekven | 340/174 |
| 3,846,769 A | 11/1974 | Shepherd | 340/174 |
| 3,905,026 A | 9/1975 | Sell | 340/174 |
| 4,360,899 A | 11/1982 | Dimyan et al. | 365/171 |
| 4,791,604 A | 12/1988 | Lienau et al. | 365/9 |
| 4,803,658 A | 2/1989 | Grimes | 365/87 |
| 4,831,427 A | 5/1989 | Coleman, Jr. | 357/27 |
| 5,768,181 A | 6/1998 | Zhu et al. | 365/158 |
| 6,005,800 A | 12/1999 | Koch et al. | 365/173 |
| 6,175,515 B1 | 1/2001 | Peczalski et al. | 365/50 |
| 6,266,267 B1 | 7/2001 | Lienau | 365/145 |

\* cited by examiner

*Primary Examiner*—Michael S. Lebentritt
*Assistant Examiner*—Nam Nguyen
(74) *Attorney, Agent, or Firm*—Theodore M. Magee; Westman, Champlin & Kelly, P.A.

(57) ABSTRACT

A method and apparatus are provided for storing and retrieving data in a non-volatile manner. The data is stored in a magnetic cell having a magnetic moment with a direction. A conductor is positioned near the cell and carries a current formed by a current driver. A data detector detects a value for data stored in the cell based on a level of current driven through the conductor.

20 Claims, 8 Drawing Sheets

METHOD AND APPARATUS FOR NON-VOLATILE MEMORY STORAGE

CROSS-REFERENCE TO RELATED APPLICATION

This application claims priority from U.S. Provisional Application 60/253,220, filed on Nov. 27, 2000 and entitled SOLID STATE RANDOM ACCESS MAGNETIC MEMORY DEVICE.

FIELD OF THE INVENTION

The present invention relates to memory devices. In particular, the present invention relates to non-volatile memory storage.

BACKGROUND OF THE INVENTION

Computer systems generally include two types of memory, volatile and non-volatile. Volatile memory is maintained in a state using electrical current. When the computer system is powered down, the data stored in volatile memory is lost. The data stored in non-volatile memory, on the other hand, persists even after the computer system has lost power.

Examples of non-volatile memory include disc drives such as magnetic and optical disc drives as well as tape drives and core memory.

In magnetic disc drives and core memory, data is stored by setting the magnetic polarity of a magnetic material. In disc drives, the magnetic polarities of small domain areas on the disc are set by a write head as it moves over the surface of the disc. To read the data from the disc, a read head moves over the disc and senses transitions in the magnetic polarity. Note that the read head must move relative to the disc in order to read the data because the read head detects the transitions in the magnetic polarity, and not the magnetic polarity itself.

The required movement of the head relative to the disc means that the disc drive must include a motor and other moving mechanical pieces. These moving pieces are difficult to control and can cause reading errors. In addition, these moving pieces are the most likely pieces to fail in a disc drive.

In core memory, an array of magnetic toroids or rings is provided. Two address wires, one a row address line and the other a column address line, pass through each ring, together with a read sensing wire. To write to a particular toroid, current is applied to the row and column address lines associated with that toroid. In particular, one half of the current needed to change the polarity of the magnetic field in the toroid is applied to each line. Thus only the toroid at the intersection of the two lines is affected by the write event. To read data from a toroid, a write signal is applied to the row and column address lines for the toroid. If this write event causes a change in the magnetic polarity of the toroid, an electric field will be generated in the read sense line. If the write event does not cause a change in the magnetic polarity of the toroid, there will be no voltage pulse on the read sense line. Thus, by monitoring the voltage on the read sense line during the write event, it is possible to read the values stored in the toroid. Note that the read is destructive since it writes to the toroid. Because of this, the toroid must be rewritten to reestablish its value after the data has been read.

In core memory, a single sense line is provided for all of the toroid cells. Because of this, when a voltage is induced on the sense line by the switching of a cell, the voltage can become dampened as it interacts with the other toroid cells. In addition, it is impossible to tell whether a voltage detected on the sense line is due to the toroid cell that is currently being addressed or is due to some other toroid cell that has experienced a thermal event which caused its magnetic polarity to flip.

Thus, a non-volatile storage system is needed that does not require moving parts and that does not require a separate sense line.

Embodiments of the present invention provide a solution to these and other problems, and offer other advantages over the prior art.

SUMMARY OF THE INVENTION

A method and apparatus are provided for storing and retrieving data in a non-volatile manner. The data is stored in a magnetic cell having a magnetic moment with a direction. A conductor passes around an arm of the cell and carries a current formed by a current driver. A data detector detects a value for data stored in the cell based on a level of current driven through the conductor.

These and various other features as well as advantages which characterize the invention will be apparent upon reading of the following detailed description and review of the associated drawings.

DETAILED DESCRIPTION OF ILLUSTRATIVE EMBODIMENTS

Figure 1:
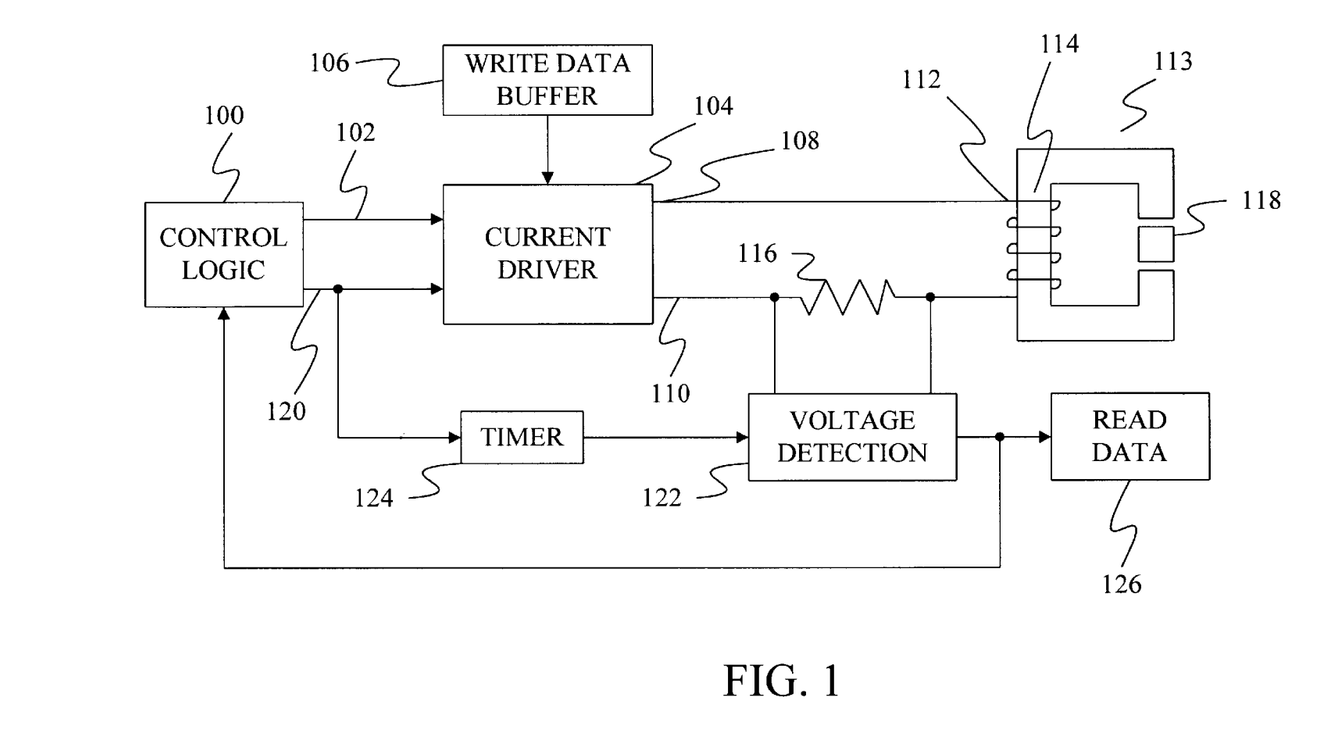
FIG. 1 is a general block diagram of a data storage system of the present invention.

FIG. 1 provides a simplified block diagram of a memory storage system of the present invention. In the memory storage system, data is stored in a magnetic cell 113 by setting the magnetic polarity of the cell 113. This is done by passing a current through a conductor that wraps around one arm of the cell 113.

In particular, to store data using the system of FIG. 1, a control logic 100 issues a write command 102 to a current driver 104. Based on write command 102, current driver 104 accesses one bit of write data from a write data buffer 106. Based on the value of the bit, current driver 104 generates a current in one of two directions. For example, if the bit is a 1, current is generated in a +I direction and if the bit is a 0 current is generated in a −I direction.

The current produced by current driver 104 appears at its output 108 and 110, such that one output is sourcing current while the other output is sinking current. The circuit connected to the outputs of current driver 104 includes a winding 112 that is in series with a resistor 116.

Winding 112 wraps around an arm of pole piece 114 of magnetic cell 113 such that as the current from current driver 104 passes through winding 112 it generates magnetic flux in magnetic cell 113. This magnetic flux extends through magnetic pole 114 and magnetic medium 118. If the generated flux is strong enough, it will cause the polarity of the magnetic moment of magnetic cell 113 to align with it.

Figure 2:
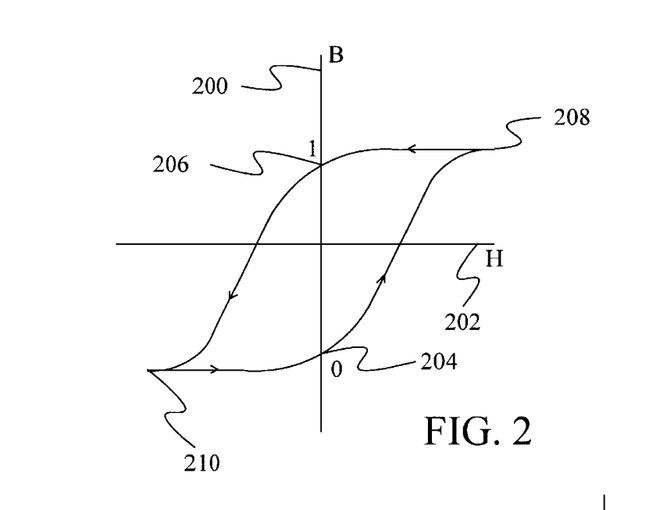
FIG. 2 is a graph of a hysteresis loop for a magnetic cell.

The physical interaction between the applied field generated by windings 112 and the magnetic polarity of magnetic cell 113 can be seen in the hysteresis loop of FIG. 2, where the magnetic flux density of cell 113 is shown along vertical axis 200 and the flux field intensity created by windings 112 is shown along horizontal axis 202. When the current in windings 112 reaches its full value in the +I direction, magnetic cell 113 moves to state 208 and when the current reaches its full value in the −I direction, magnetic cell 113 moves to state 210. When the current is reduced to zero after reaching state 208, magnetic cell 113 moves to state 206. Similarly, when the current is reduced to zero after reaching state 210, magnetic cell returns to state 204. Thus, states 204 and 206 represent the two different polarity states for cell 113. In FIG. 2, state 204 is indicated as representing a 0 and state 206 is indicated as representing a 1.

To read the data stored in magnetic cell 113, control logic 100 issues a read command 120 to current driver 104. Based on this command, current driver 104 generates a write current associated with a value of "1". As can be seen in FIG. 2, when this write current is applied to a cell 113 that is in state 206, the magnetic flux density does not change much as the cell moves to state 208. In particular, the polarity of the flux density does not change. On the other hand, if the write current is applied to a cell that is in state 204, the flux density changes considerably and even changes polarity.

Because moving from state 204 to state 208 involves a switch in the polarity of the magnetic moment, this transition between states will induce an EMF in windings 112 that opposes the current causing the transition. This EMF limits the rate at which current driver 104 is able to reach its desired current level. This can be seen more clearly in FIG. 3 which shows a graph of the current provided by current driver 104 as a function of time.

Figure 3:
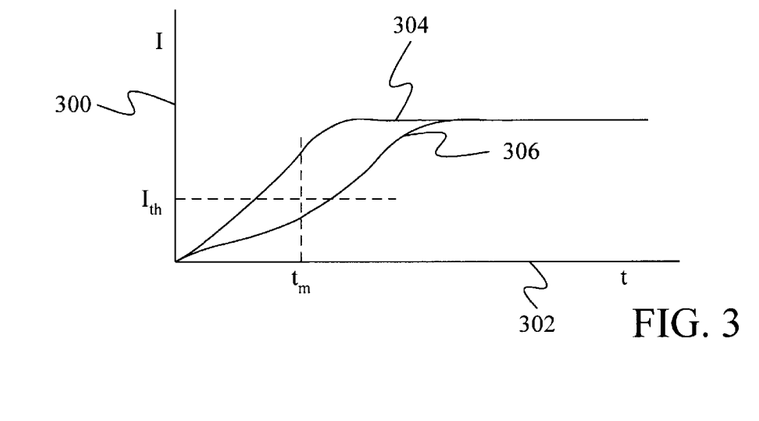
FIG. 3 is a graph of write current as a function of time for magnetic cells having different magnetic polarities.

In FIG. 3, current is shown along vertical axis 300 and time is shown along horizontal axis 302. Graph 304 of FIG. 3 shows the change in current as a function of time when magnetic cell 113 begins in state 206 and moves to state 208. Graph 306 shows the change in current when magnetic cell 113 starts in state 204 and moves to state 208. From the graphs in FIG. 3, it can be seen that if magnetic cell 113 is storing a value of 0, it will take longer for the current to reach its maximum value than if magnetic cell 113 is storing a 1.

The present inventor has discovered that the difference in the current can be used to detect the value that was stored in magnetic cell 113. In particular, at a time $t_m$ after current driver 104 begins to write, the current provided by current driver 104 can be measured to determine the state of magnetic cell 113. The current measured at time $t_m$ is then compared to a threshold current $I_{th}$. If the current is above the threshold current, magnetic cell 113 is considered to have been storing a value of 1 and if the current is below the threshold current, magnetic cell 113 is considered to have been storing a 0.

In FIG. 1, the magnitude of the current is measured by a data detector that includes a voltage detection system 122, which detects the voltage across resistor 116 as the current from driver 104 passes through resistor 116. Voltage detection system 122 compares this voltage to a threshold voltage at a time set by a timer 124, which provides a control signal at a set time after control logic 100 issues a write command. The output of voltage detection unit 122 is the data stored in cell 113, which becomes read data 126.

The data detected by voltage detection unit 122 is returned to control logic 100. This is done because the read event is destructive if the data read is a 0. In other words, since reading is accomplished by writing a "1" to cell 113, if cell 113 originally contained a 0, the 0 would be converted to a 1 by the read operation and thereby destroyed. To correct for this, control logic 100 examines whether the read data is a 0 or a 1. If the read data is 0, control logic 100 issues a write command to current driver 104 to cause current driver 104 to write a 0 to the cell 113.

Figure 4:
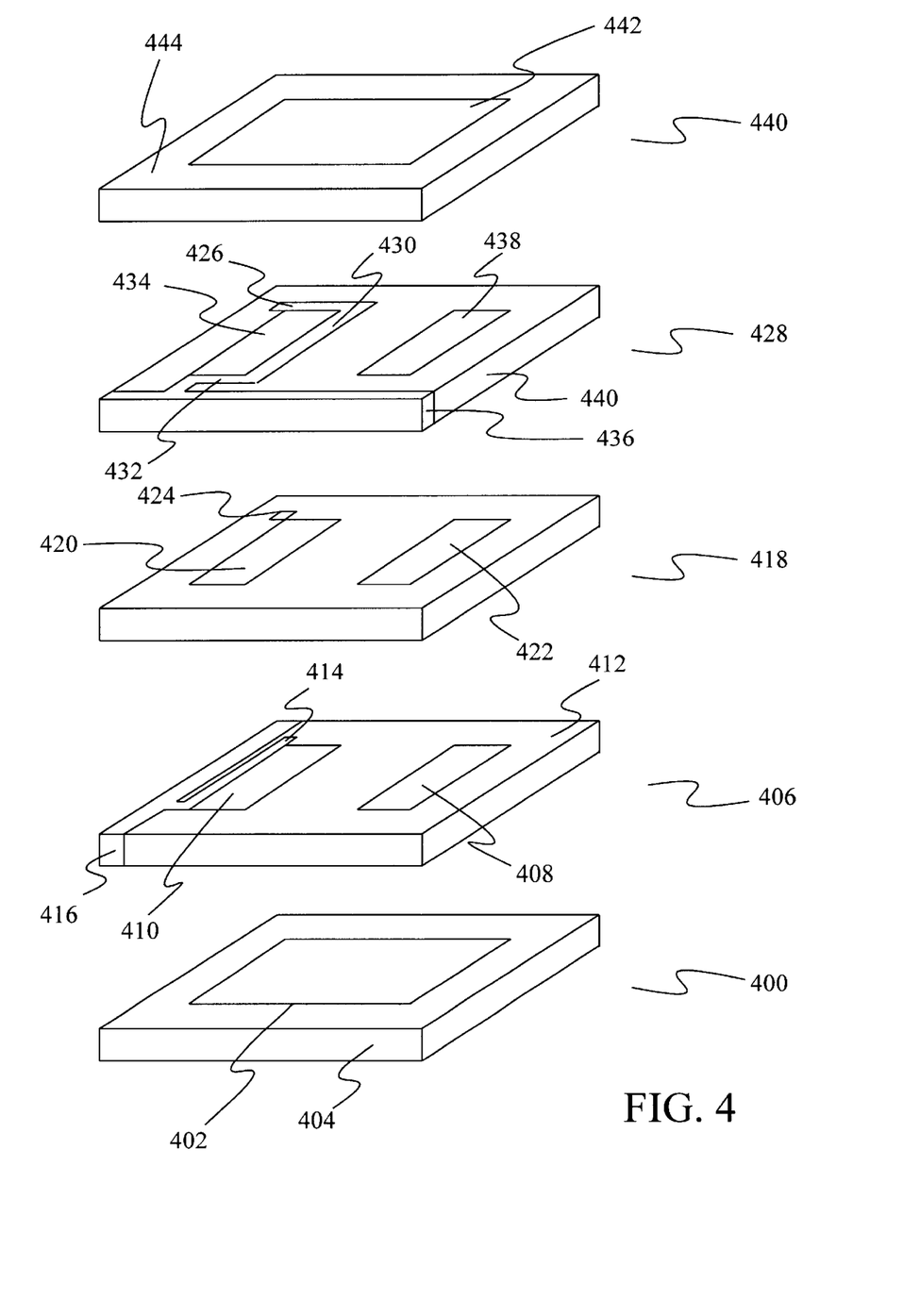
FIG. 4 is an exploded isometric view of a magnetic cell under one embodiment of the present invention.

FIG. 4 provides an exploded isometric view of one embodiment of a memory cell such as memory cell 113 of FIG. 1. In the embodiment of FIG. 4, the memory cell is divided into five deposition planes 400, 406, 418, 428, and 440 that roughly correspond to planes that would be formed during a photolithography process used to form the magnetic cell.

Deposition plane 400 includes a bottom magnetic pole piece 402 surrounded by an insulator 404. Above deposition plane 400 is deposition plane 406, which contains two magnetic pole pieces 408 and 410 that extend through the entire deposition plane 406. Magnetic pole piece 408 is surrounded by an insulating material 412 that also borders three sides of the magnetic pole piece 410.

An electrically conductive material 414 extends along one side of magnetic pole piece 410 and connects to a conductive strip 416. Conductive strip 416 forms part of a column address line that connects a column of memory cells together in an array of memory cells, discussed further below. Conductor 414 forms part of a winding around one arm of the magnetic cell.

Above deposition layer 406 is deposition layer 418, which includes magnetic pieces 420 and 422 that extend through the entire deposition layer. Deposition layer 418 also includes a conductive via 424 that provides a conductive path between conductive layer 414 of deposition layer 406 and a conductive trace 426 in deposition layer 428. The remainder of deposition layer 418 is an insulating material that borders magnetic pieces 420 and 422 and conductive via 424.

Deposition layer 428 includes conductive traces 426, 430 and 432, which border three respective sides of a magnetic piece 434. Together, conductive traces 426, 430, 432, and 414 and via 424 form a single turn around a magnetic pole piece formed from the combination of magnetic pieces 410, 420 and 434. Note that although only one turn is shown in the embodiment of FIG. 4, additional layers could be added to provide additional turns. Thus, the present invention is not limited to a memory cell that includes a single turn but may be practiced with any number of turns. In addition, although the conductive traces are shown next to the pole piece in FIG. 4, in other embodiments, an insulating material separates the conductive strips from the pole piece.

Deposition layer 428 also includes a conductive strip 436 that connects to conductive trace 432. Conductive strip 436 forms part of a row address conductor that connects to a row of memory elements in an array of memory elements discussed further below.

Deposition layer 428 also includes magnetic material 438 and an insulating material 440 that surrounds magnetic material 438 and borders the outside of conductive traces 436, 430, 432 and 426, as well as the edge of magnetic material 434 that is not bordered by a conductive trace.

The final deposition layer is layer 440 which includes a magnetic top piece 442 that extends through deposition layer 440 and is surrounded by an insulating material 444. Together, magnetic top piece and magnetic pieces 434, 438, 420, 422, 410, 408 and 402 form a magnetic cell. Note that the magnetic material in this cell may be uniform or different portions of it may be made formed of different types of material. For example, in one embodiment of the present invention, magnetic material 422 forms the magnetic medium 118 of FIG. 1 and is constructed from a different magnetic material than the remainder of the cell. In other embodiments, bottom magnetic material 402 forms the magnetic medium and is formed of a different material from the remainder of the cell. In addition, although the cell of FIG. 4 is shown as being continuous, in other embodiments, it is interrupted with nonmagnetic material inserted between the magnetic medium and the remainder of the cell.

In addition, as discussed further below, the magnetic material does not need to be homogenous. Instead, materials with different permeabilities may be combined in the cell such that domains of different permeability exist in the cell. As discussed further below, this allows for multiple levels of magnetic moment switching thereby allowing multiple bits to be stored in a single magnetic cell.

Figure 5:
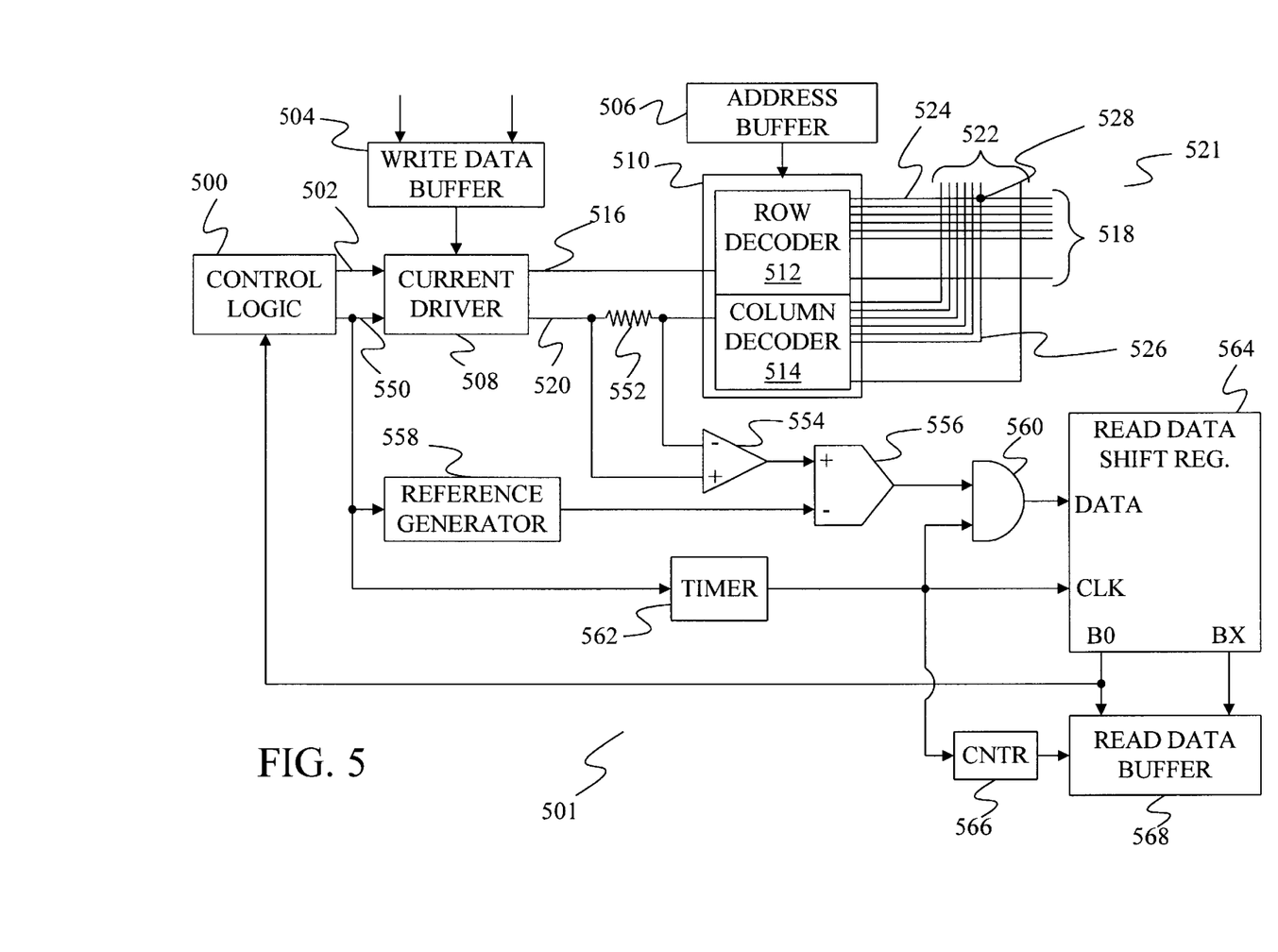
FIG. 5 is a more detailed block diagram of a memory storage device under the present invention.

FIG. 5 provides a more detailed block diagram of a memory storage system 501 of the present invention in which an array of memory cells 521 is used to store data. In FIG. 5, control logic 500 issues a write command 502 to write data stored in a write data buffer 504 to an address set in an address buffer 506. Upon receiving the write command, current driver 508 shifts the next bit of data out of write data buffer 504 and attempts to drive a current based on the data bit. Under one embodiment, write data buffer 504 is a 32 bit shift register that receives 32 bits in parallel and shifts out one bit at a time.

The current provided by current driver 508 is directed to a particular memory cell by an address decoder 510 that includes a row decoder 512 and column decoder 514. Row decoder 512 is connected to output 516 of current driver 508 and column decoder 514 is coupled through resistor 552 to output 520 of current driver 508. Based on the address provided by address buffer 506, address decoder 510 connects output 516 of current driver 508 with one of a plurality of row lines 518 while connecting output 520 of current driver 508 with one of a plurality of column lines 522. For example, by connecting output 516 to row line 524 and output 520 to column line 526, address decoder 510 is able to address memory cell 528 located at the intersection of row line 524 and column line 526. With such a connection, current from current driver 508 will flow through row line 524, around the windings of memory cell 528, through column line 526 and resistor 552 to output 520 of current driver 508. Since no other cell in the array has a complete conductive path, no other cell is influenced by the write current. Thus, current driver 508 is able to write the data of write data buffer 504 to a particular address set by address buffer 506.

The number of cells in the array of cells 521 is a function of the number of bits in an address. For example, for a 32 bit address, over 4.2 billion memory cells would be provided in the memory array.

Figure 6:
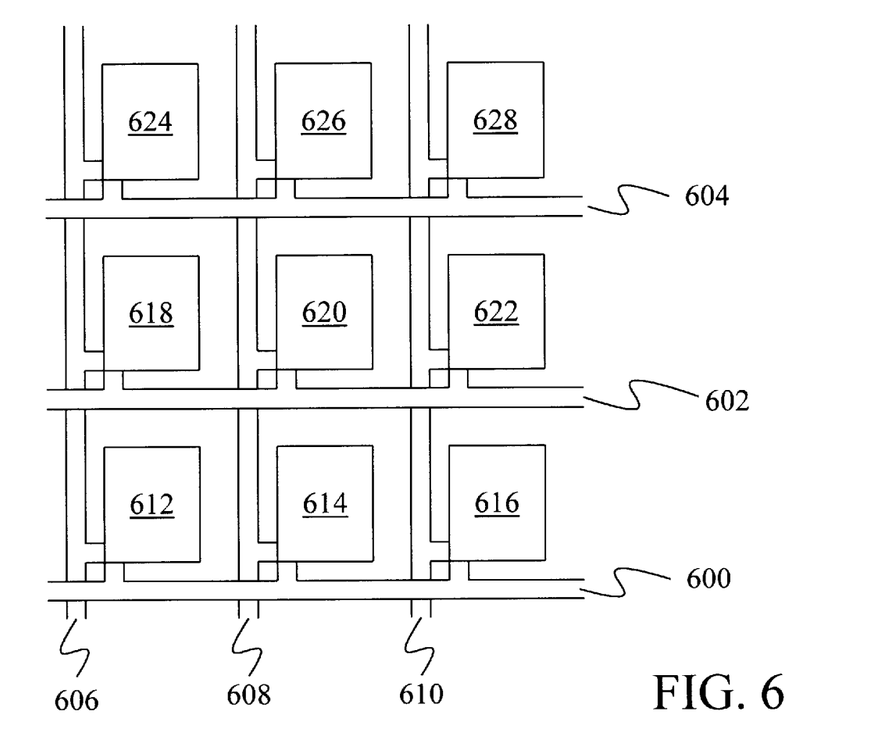
FIG. 6 is a more detailed top view of an array of memory storage cells under the present invention.

FIG. 6 provides a top view of memory array 521 of FIG. 5. In FIG. 6, row lines 600, 602 and 604 and column lines 606, 608 and 610 connect with memory cells 612, 614, 616, 618, 620, 622, 624, 626 and 628. As shown in FIG. 4, column lines 606, 608 and 610 are in a different physical layer of the memory array from row lines 600, 602 and 604. In FIG. 6, each of the memory cells has an identical structure as the other memory cells, and the structure is similar to that shown in FIG. 4.

Figure 7:
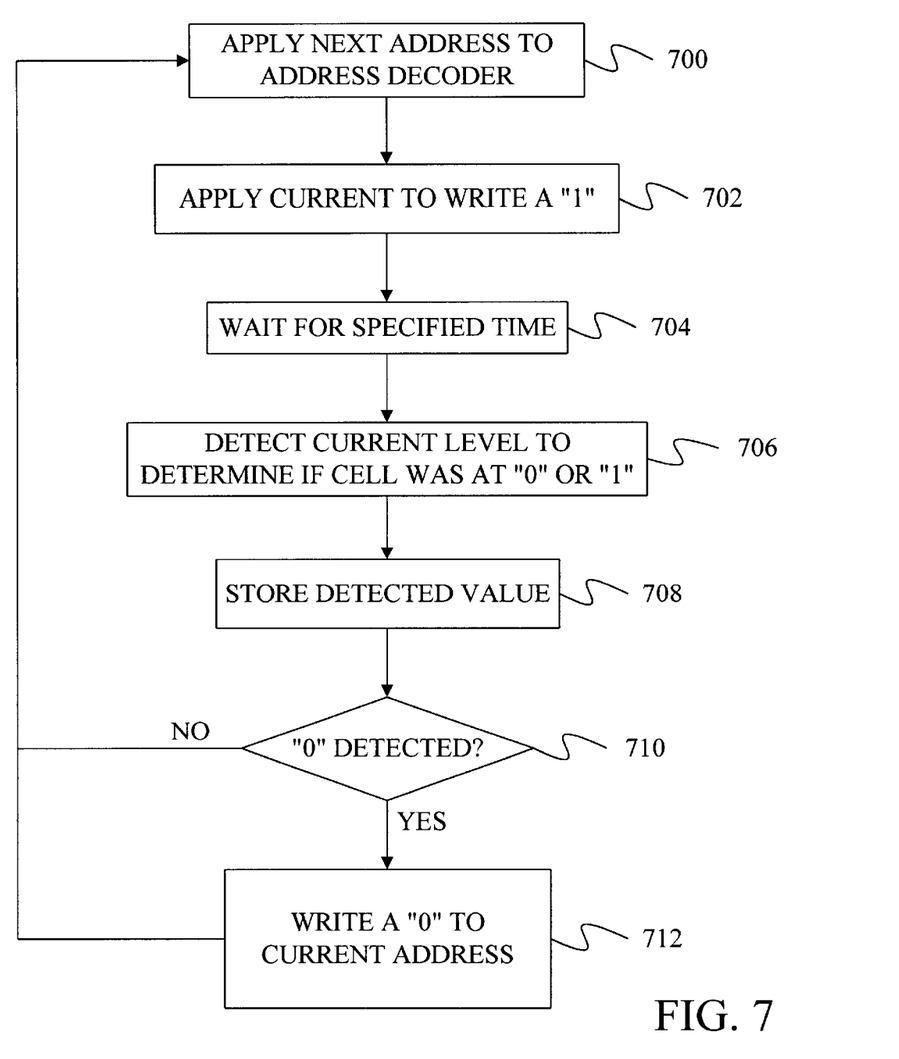
FIG. 7 is a flow diagram of a method of reading data from memory cells of the present invention.

FIG. 7 provides a flow diagram of a method of reading data from cell array 521. In step 700 of FIG. 7, the address of the next cell to be accessed is taken from address buffer 506 and is applied to address decoder 510. At step 702, control logic 500 issues a read command 550 to current driver 508 so that current driver 508 generates a current associated with a logical "1". This current is routed by address decoder 510 to the memory cell specified by the address from address buffer 506.

The current generated by current driver 508 passes through resistor 552 and thereby develops voltage across resistor 552. This voltage is amplified by an amplifier 554 and is provided to a comparator 556.

Comparator 556 compares the voltage from amplifier 554 to a reference voltage produced by a reference generator 558. If the sensed voltage is above the reference voltage, comparator 556 generates a logical 1. If the sensed voltage is below the reference voltage, comparator 556 generates a logical 0.

The value of the comparison is captured in time by an AND gate 560 that receives the output of comparator 556 as well as the output of a timer 562. Timer 562 generates a pulse a specified time after read command 550 is issued as indicated by step 704 of FIG. 7. This pulse causes the value at the output of comparator 556 to be transferred to the output of AND gate 560 at step 706 and to be captured in a read data shift register 564 at step 708. Each pulse from timer 562 also increments a counter 566 which is used to load a read data buffer 568 with data from shift register 564 when shift register 564 has received a complete word of data. (In this context, a word of data can contain any number of desired bits such as 8, 16, 32, 64, or 128).

The last bit to be entered into shift register 564 appears as bit B0 in the shift register. This bit is fed back to control logic 500, which uses the value of the bit at step 710 to determine whether the memory cell must be rewritten. As described above, when the data bit read from the memory cell is a 0, the control logic must rewrite the 0 to the memory cell since 0 values are destroyed during the reading process. Thus, if the detected bit is a 0 at step 710, a 0 is rewritten to the current address at step 712. If a 0 was not detected at step 710, or after a 0 has been rewritten to the current cell, the next address is selected by returning to step 700.

Although the embodiments described above suggest that each cell has one of two states, other embodiments of the present invention use cells with multiple states. Such cells can be constructed by forming the magnetic pole piece and/or medium in the cells out of a collection of distinct magnetic materials that each has a different hysteresis loop and its own magnetic moment.

Figure 8:
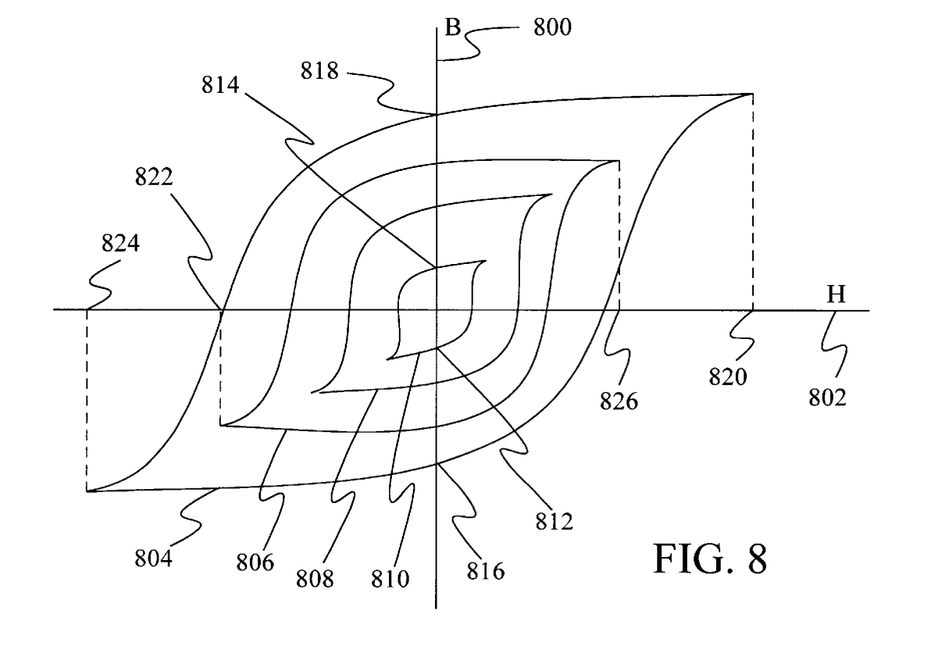
FIG. 8 is a hysteresis graph showing multiple hysteresis loops for a magnetic cell containing different domain types.

FIG. 8 shows a graph of four hysteresis loops 804, 806, 808 and 810 for four different materials found within a single memory cell of one embodiment of the present invention. In FIG. 8, the magnetic flux density is shown on vertical axis 800 and the applied field intensity is shown along horizontal axis 802. Each hysteresis loop represents a separate bit in the memory cell. For example, hysteresis loop 810 provides a 0 bit at point 812 and a 1 bit at point 814. Similarly, hysteresis loop 804 provides a 0 bit at point 816 and a 1 bit a point 818.

To write data to a multi-bit cell, the data for the outer hysteresis loops is written first, followed by data for the next smaller hysteresis loop and so forth until reaching the smallest hysteresis loop. For example, in FIG. 8, a 1 can be written to outer hysteresis loop 804 by applying an H field 820. A 0 can then be written to hysteresis 806 by applying an H field 822. Because H field 822 is less than H field 824, the point at which hysteresis loop 804 would switch to a 0, the logical 1 written to hysteresis loop 804 is maintained while writing a 0 to hysteresis loop 806.

Control logic 500 of FIG. 5 controls which hysteresis loop is written to in a memory cell by issuing a particular write command 502 to current driver 508. This write command instructs current driver 508 to write using a particular current level to address a particular bit within a memory cell.

Reading values from a multi-level memory cell requires that each hysteresis loop that is inside of a target hysteresis loop be read before the target hysteresis loop value is read. This requirement is the result of the fact that reading from the target hysteresis loop will destroy any logical zeros that are stored in hysteresis loops found within the target hysteresis loop. For example, to read the bit value stored in hysteresis loop 806, a current is applied to write a 1 to hysteresis loop 806. Thus, a current is provided that generates a magnetic field intensity 826. This magnetic field intensity is strong enough to cause the magnetic domains associated with hysteresis loop 808 and hysteresis loop 810 to switch to a 1.

Figure 9:
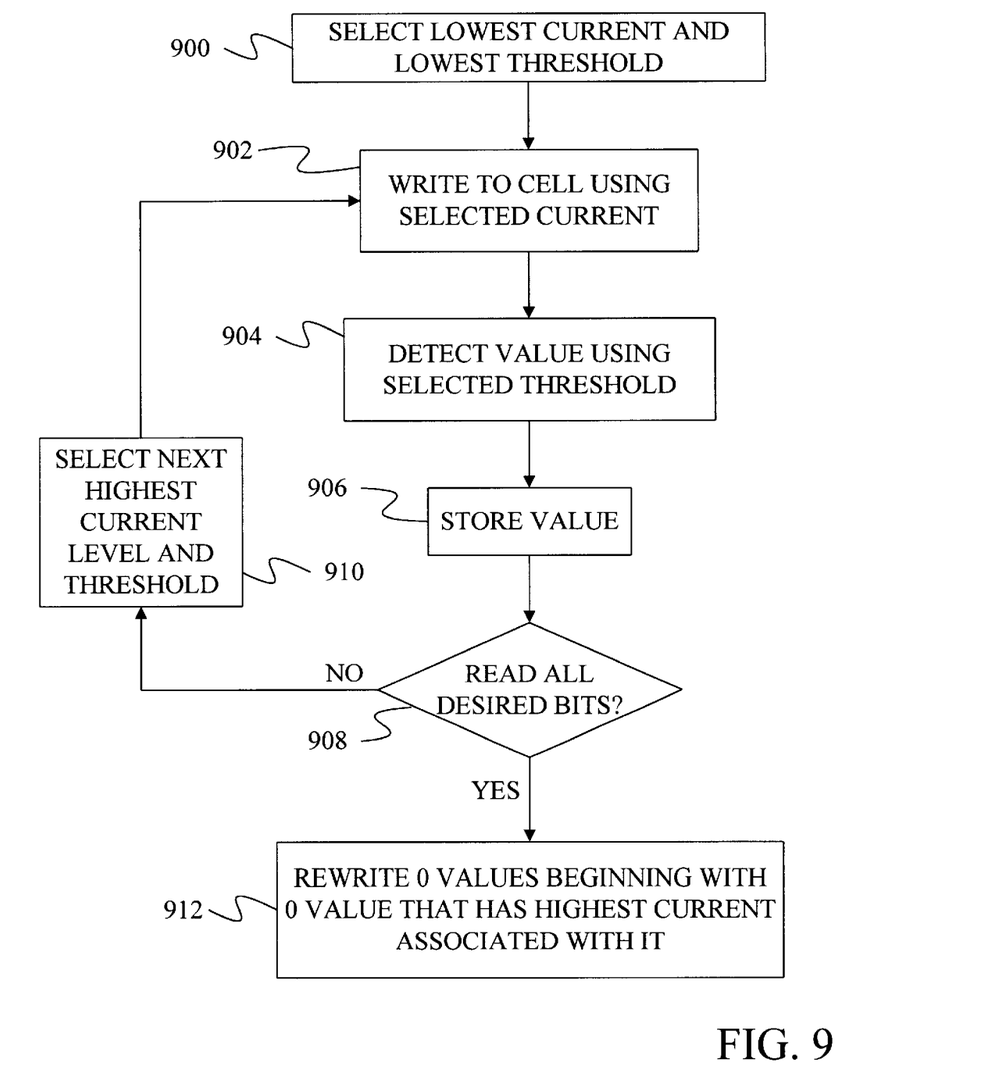
FIG. 9 is a flow diagram for reading data from a magnetic cell having multiple levels.

The process for reading a bit from a multi-level memory cell is shown in FIG. 9. To perform the read operation, current driver 508 is equipped to generate a plurality of current levels based on the read or write command received from control logic 500. Thus, current driver 508 can generate a separate current for each hysteresis loop. In addition, reference generator 558 is equipped to output a separate reference voltage for each hysteresis loop. The separate reference voltage is required since the current level will be different for different hysteresis loops resulting in a different sensed voltage.

In step 900 of FIG. 9, control logic 500 issues a read command to current driver 508 and reference generator 558. The read command instructs current driver 508 to generate the lowest current level, the current level associated with the innermost hysteresis loop, and instructs reference generator 558 to select the lowest threshold voltage for comparison by comparator 556. In step 902, current driver 508 writes to the memory cell using the selected current. At step 904, the value stored in the hysteresis loop associated with the selected current is detected using the threshold voltage provided by reference generator 558. At step 906, the detected value is stored.

At step 908, a determination is made as to whether the desired bit has been read from the memory cell. If the desired bit has not been read, control logic 500 issues a read command to read a bit from the next higher hysteresis loop. This causes current driver 508 to select the next highest current when writing a 1 to the memory cell and causes reference generator 558 to select the next highest threshold voltage for comparison at step 910.

After the desired bit has been read at step 908, zeros read from the memory cell are rewritten into the memory cell at step 912 beginning with the outermost hysteresis loop from which a 0 was read. Thus, control logic 500 first issues a write command that causes current driver 508 to write a 0 to the outermost hysteresis loop from which a 0 was read. After writing the 0, control logic 500 examines the stored values to find the next 0 that was detected. Control logic then writes a 0 at the hysteresis loop associated with that detected 0. This continues until control logic 500 reaches the innermost hysteresis loop that was detected as containing a 0.

Note that although FIG. 8 shows four hysteresis loops, any number of hysteresis loops may be used within a memory cell. In particular, a memory cell may contain eight hysteresis loops allowing for a complete 8-bit data word to be stored in each memory cell.

In summary, a non-volatile storage device 501 includes a memory cell 113, 528 having a magnetic moment with a direction. A conductor 112, 524, 526 passes around an arm 114 of the memory cell 113, 528 to form at least one turn. A current driver 104, 508 is coupled to the conductor 112, 524, 526 and drives current through the conductor 112, 524, 526 to read data stored in the memory cell 113, 528. A data detector 116, 122, 552, 554, 556, 558, 560, 562, 564, detects a value for data stored in the memory cell 113, 528 based on a level of current 304, 306 driven through the conductor 112, 524, 526.

In addition, a method of retrieving data from a non-volatile storage device 501 is provided. In the method, a first current is applied to a coil 112 that is wrapped around an arm of a magnetic cell 113. After waiting a period of time, a level of current 304, 306 being applied to the coil 112 is determined. Based on that level of current, a value for a first bit of data stored in the magnetic cell 113 is determined.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the memory storage system while maintaining substantially the same functionality without departing from the scope and spirit of the present invention. In addition, although the preferred embodiment described herein is directed to a memory storage device for a computer system, it will be appreciated by those skilled in the art that the teachings of the present invention can be applied to other systems, like hand-held devices, appliances, motor vehicles, aircraft, satellites, or other consumer electronics, without departing from the scope and spirit of the present invention.

What is claimed is:

1. A non-volatile storage device for storing data, the storage device comprising:
   a memory cell containing magnetic material having a magnetic moment with a direction, wherein the direction of the magnetic moment of at least a portion of the magnetic material represents stored data;
   a conductor that passes around an arm of the memory cell to form at least one turn;
   a current driver coupled to the conductor that drives current through the conductor to read data stored in the memory cell; and
   a data detector that detects a value for data stored in the memory cell based on a level of current driven through the conductor.

2. The storage device of claim 1 wherein the memory cell is formed through a process involving photolithography.

3. The storage device of claim 1 wherein the memory cell comprises a magnetic pole piece and a magnetic medium.

4. The storage device of claim 3 wherein the magnetic pole piece forms an open loop and no portion of the magnetic medium is between any two portions of the magnetic pole piece.

5. The storage device of claim 4 wherein the magnetic medium is formed as a horizontal plane.

6. The storage device of claim 3 wherein the magnetic pole piece forms an open loop and at least a portion of the magnetic medium is between two portions of the magnetic pole piece.

7. The storage device of claim 6 wherein the magnetic medium is above one portion of the magnetic pole piece and below a second portion of the magnetic pole piece.

8. The storage device of claim 3 wherein the magnetic medium is formed of a different material from the magnetic pole piece.

9. The storage device of claim 1 wherein the data detector detects a value based on a level of current driven through the conductor at a particular time after the current driver begins to drive current through the conductor.

10. The storage device of claim 9 wherein the data detector comprises:
    a voltage detector that detects a sensed voltage generated by the current in the conductor passing through a resistance; and
    a comparator that compares the sensed voltage to a threshold voltage to identify the value for the stored data.

11. The storage device of claim 1 further comprising an array of memory cells.

12. The storage device of claim 11 wherein the conductor comprises a set of conductive row lines and a set of conductive column lines and wherein the storage device further comprises an address decoder for coupling a conductive row line and a conductive column line to the current driver so that current flows through the conductive row line and the conductive column line.

13. The storage device of claim 1 wherein the memory cell has at least two domains, each with a separate magnetic moment, the direction of the magnetic moment of a first domain representing a first bit and the direction of the magnetic moment of a second domain representing a second bit.

14. A method of retrieving data from a non-volatile storage device, the method comprising steps of:
    (a) beginning to apply a first current to a coil wrapped around an arm of a magnetic cell, the first current eventually having a final magnitude;
    (b) waiting a period of time;
    (c) determining a level of the current being applied to the coil after the period of time; and
    (d) determining a value for a first bit of data stored in the magnetic cell based on the level of the current after the period of time.

15. The method of claim 14 further comprising connecting a current driver to the coil wrapped around the arm of the magnetic cell by decoding an address that distinguishes the magnetic cell from other magnetic cells in an array of magnetic cells.

16. The method of claim 14 wherein the method further comprises steps of:
    (e) beginning to apply a second current to the coil wrapped around the arm of the magnetic cell, the second current having a final magnitude that is larger than the final magnitude of the first current;
    (f) waiting a period of time;
    (g) determining a level of the current being applied to the coil after the period of time; and
    (h) determining a value for a second bit of data that is stored in the magnetic cell based on the level of the current after the period of time, the second bit of data being stored in the magnetic cell along with a first bit of data.

17. The method of claim 16 further comprising steps of:
    (i) applying a third current to the coil to write the value of the second bit read from the memory cell back to the memory cell, the third current having a final magnitude that matches the final magnitude of the second current; and
    (j) applying a fourth current to the coil to write the value of the first bit read from the memory cell back to the memory cell, the fourth current having a final magnitude that matches the final magnitude of the first current.

18. A data storage device for storing data, the data storage device comprising:
    a write line that loops around at least a portion of a magnetic cell; and
    reading means for retrieving a stored data value from the magnetic cell by applying a current to the write line and sensing the level of current in the write line.

19. The data storage device of claim 18 further comprising an array of write lines and magnetic cells.

20. The data storage device of claim 18 wherein the reading means senses the level of the current before the current reaches its maximum value.

* * * * *